(12) United States Patent
Liu et al.

(10) Patent No.: US 10,572,752 B2
(45) Date of Patent: Feb. 25, 2020

(54) FINGERPRINT IDENTIFICATION PANEL AND PREPARATION METHOD THEREOF, DRIVING METHOD AND FINGERPRINT IDENTIFICATION DEVICE

(71) Applicant: BOE TECHNOLOGY GROUP CO., LTD., Beijing (CN)

(72) Inventors: Yingming Liu, Beijing (CN); Xue Dong, Beijing (CN); Haisheng Wang, Beijing (CN); Xiaoliang Ding, Beijing (CN); Yuzhen Guo, Beijing (CN); Lin Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 32 days.

(21) Appl. No.: 16/027,844

(22) Filed: Jul. 5, 2018

(65) Prior Publication Data

US 2019/0205684 A1    Jul. 4, 2019

(30) Foreign Application Priority Data

Jan. 3, 2018  (CN) .......................... 2018 1 0004556

(51) Int. Cl.
*G06K 9/28*    (2006.01)
*G06K 9/20*    (2006.01)
(Continued)

(52) U.S. Cl.
CPC ........... *G06K 9/209* (2013.01); *G06K 9/0002* (2013.01); *G06K 9/0004* (2013.01);
(Continued)

(58) Field of Classification Search
CPC . G06K 9/0002; G06K 9/00004–00046; G06K 9/00006–0012
See application file for complete search history.

(56) References Cited

U.S. PATENT DOCUMENTS

2004/0252867 A1* 12/2004 Lan ...................... G06K 9/0004
                                                           382/124
2007/0147668 A1    6/2007 Endo
(Continued)

FOREIGN PATENT DOCUMENTS

CN        104881196 A      9/2015
CN        105159506 A     12/2015
(Continued)

OTHER PUBLICATIONS

The First Chinese Office Action dated Oct. 23, 2019; Appln. No. 201810004556.6.

*Primary Examiner* — Brian Werner
(74) *Attorney, Agent, or Firm* — Ladas & Parry LLP

(57) ABSTRACT

A fingerprint identification panel and a preparation method thereof, a driving method and a fingerprint identification device are provided. A driving electrode and a sensing electrode are provided between a base substrate and a cover plate, the driving electrode and the sensing electrode intersecting with each other define an identification unit, a photoelectric converter unit is provided in the identification unit. The photoelectric converter unit includes a light shielding electrode, a second electrode, and a photoelectric converter layer located between the light shielding electrode and the second electrode. The light shielding electrode is located between the photoelectric converter layer and the base substrate. The light shielding electrode includes a first electrode, one of the first electrode and the second electrode is electrically connected with the driving electrode, and the other of the first electrode and the second electrode is electrically connected with the sensing electrode.

17 Claims, 7 Drawing Sheets

(51) Int. Cl.
*H01L 27/146* (2006.01)
*G06K 9/00* (2006.01)

(52) U.S. Cl.
CPC .. *H01L 27/14623* (2013.01); *H01L 27/14636* (2013.01); *H01L 27/14685* (2013.01); *G06K 9/0008* (2013.01); *H01L 27/14678* (2013.01)

(56) References Cited

U.S. PATENT DOCUMENTS

| | | | |
|---|---|---|---|
| 2016/0148036 A1* | 5/2016 | Kim | G06K 9/0002 382/124 |
| 2017/0097702 A1* | 4/2017 | Chang | G06F 3/044 |
| 2017/0147850 A1 | 5/2017 | Liu et al. | |
| 2019/0019850 A1 | 1/2019 | Xu et al. | |
| 2019/0065809 A1 | 2/2019 | Li et al. | |
| 2019/0114030 A1* | 4/2019 | Shen | G06F 3/0416 |
| 2019/0227362 A1 | 7/2019 | Sun et al. | |

FOREIGN PATENT DOCUMENTS

| | | |
|---|---|---|
| CN | 106096595 A | 11/2016 |
| CN | 106298805 A | 1/2017 |
| CN | 106778485 A | 5/2017 |
| CN | 106897699 A | 6/2017 |
| CN | 106920860 A | 7/2017 |
| CN | 107066976 A | 8/2017 |
| CN | 107272244 A | 10/2017 |
| CN | 107425041 A | 12/2017 |

* cited by examiner

FINGERPRINT IDENTIFICATION PANEL AND PREPARATION METHOD THEREOF, DRIVING METHOD AND FINGERPRINT IDENTIFICATION DEVICE

The present application claims priority of Chinese Patent Application No. 201810004556.6 filed on Jan. 3, 2018, the disclosure of which is incorporated herein by reference in its entirety as part of the present application.

TECHNICAL FIELD

Embodiments of the present disclosure relate to a fingerprint identification panel and a preparation method thereof, a driving method and a fingerprint identification device.

BACKGROUND

With development of science and technology, an electronic product with a biometric identification function gradually enters people's life and work. Due to uniqueness and invariability, a fingerprint may be used for personal identification. Therefore, a fingerprint identification technology has attracted much attention.

SUMMARY

According to embodiments of the disclosure, a fingerprint identification panel is provided. The fingerprint identification panel comprises: a base substrate and a cover plate provided opposite to each other. A driving electrode and a sensing electrode insulated from and intersecting with each other are provided between the base substrate and the cover plate, the driving electrode and the sensing electrode intersecting with each other define an identification unit, the identification unit is provided therein with a photoelectric converter unit; the photoelectric converter unit includes: a light shielding electrode, a second electrode and a photoelectric converter layer, the photoelectric converter layer is located between the light shielding electrode and the second electrode, and the light shielding electrode is located between the photoelectric converter layer and the base substrate; and the light shielding electrode includes a first electrode, one of the first electrode and the second electrode is electrically connected with the driving electrode, and the other of the first electrode and the second electrode is electrically connected with the sensing electrode.

For example, the first electrode is made of a light-shielding conductive material, and an orthogonal projection of the photoelectric converter layer on a plane where the first electrode is located is located within a region where the first electrode is located.

For example, the light shielding electrode further comprises a light shielding pattern provided in a layer different from the first electrode, and an orthogonal projection of the photoelectric converter layer on a plane where the light shielding pattern is located is located within a region where the light shielding pattern is located.

For example, the light shielding pattern is located between the first electrode and the base substrate.

For example, the light shielding pattern is located between the first electrode and the photoelectric converter layer, and the light shielding pattern is made of a light-shielding conductive material.

For example, the first electrode is electrically connected with and is provided in a same layer as the driving electrode, and the second electrode is electrically connected with and is provided in a same layer as the sensing electrode.

For example, the first electrode is electrically connected with and is provided in a same layer as the sensing electrode, and the second electrode is electrically connected with and is provided in a same layer as the driving electrode.

According to the embodiments of the disclosure, a fingerprint identification device is provided. The fingerprint identification device comprises the fingerprint identification panel as described above.

According to the embodiments of the disclosure, a preparation method of a fingerprint identification panel is provided. The method comprises: forming a driving electrode and a sensing electrode insulated from and intersecting with each other on a base substrate, in which, the driving electrode and the sensing electrode intersecting with each other define an identification unit; forming a photoelectric converter unit within the identification unit, in which, the photoelectric converter unit includes a light shielding electrode, a second electrode and a photoelectric converter layer, the photoelectric converter layer is located between the light shielding electrode and the second electrode, the light shielding electrode is located between the photoelectric converter layer and the base substrate, the light shielding electrode includes a first electrode, one of the first electrode and the second electrode is electrically connected with the driving electrode, and the other of the first electrode and the second electrode is electrically connected with the sensing electrode; and forming a cover plate on a side of the photoelectric converter unit facing away from the base substrate.

For example, the forming the driving electrode and the sensing electrode and the forming the photoelectric converter unit include: forming the driving electrode and the first electrode on the base substrate by using a single patterning process, the first electrode being electrically connected with the driving electrode; forming the photoelectric converter layer by using a single patterning process on a side of the first electrode facing away from the base substrate; forming an insulating layer by using a single patterning process on a side of the driving electrode facing away from the base substrate, and forming a via hole at a portion of the insulating layer corresponding to the photoelectric converter layer to expose the photoelectric converter layer; and forming the sensing electrode and the second electrode by using a single patterning process on a side of the insulating layer facing away from the base substrate, the second electrode being electrically connected with the sensing electrode, and the second electrode being connected with the photoelectric converter layer through the via hole.

For example, the forming the driving electrode and the sensing electrode and the forming the photoelectric converter unit include: forming the sensing electrode and the first electrode on the base substrate by using a single patterning process, the first electrode being electrically connected with the sensing electrode; forming the photoelectric converter layer by using a single patterning process on a side of the first electrode facing away from the base substrate; forming an insulating layer by using a single patterning process on a side of the sensing electrode facing away from the base substrate, and forming a via hole at a portion of the insulating layer corresponding to the photoelectric converter layer to expose the photoelectric converter layer; and forming the driving electrode and the second electrode on the side of the insulating layer facing away from the base substrate, the second electrode being connected with the driving electrode, and the second electrode being connected with the photoelectric converter layer through the via hole.

For example, the first electrode is made of a light-shielding conductive material, and an orthogonal projection of the photoelectric converter layer on a plane where the first electrode is located is located within a region where the first electrode is located.

For example, the light shielding electrode further comprises a light shielding pattern, the light shielding pattern and the first electrode are provided in different layers, and an orthogonal projection of the photoelectric converter layer on a plane where the light shielding pattern is located is located in a region where the light shielding pattern is located.

For example, the light shielding pattern is located between the first electrode and the base substrate.

For example, the light shielding pattern is located between the first electrode and the photoelectric converter layer, and the light shielding pattern is made of a light-shielding conductive material.

According to the embodiments of the disclosure, a driving method of a fingerprint identification panel is provided, and the fingerprint identification panel is the fingerprint identification panel as described above. The driving method comprises: inputting a scan driving signal to the driving electrode.

For example, the fingerprint identification panel comprises a plurality of driving electrodes and a plurality of sensing electrodes, the plurality of driving electrodes and the plurality of sensing electrodes intersect with each other to define a plurality of identification units, and each of the plurality of identification units includes a photoelectric converter unit; and the method comprises: sequentially inputting the scan driving signal to the plurality of driving electrodes; inputting the scan driving signal to one of the plurality of driving electrodes, and meanwhile, inputting a constant voltage signal to others of the plurality of driving electrodes and inputting the constant voltage signal to the plurality of sensing electrodes.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "up", "down", "left", "right" and the like are only used for expressing relative positional relationship, the relative positional relationship may be correspondingly changed in the case that the absolute position of a described object is changed.

Figure 1:
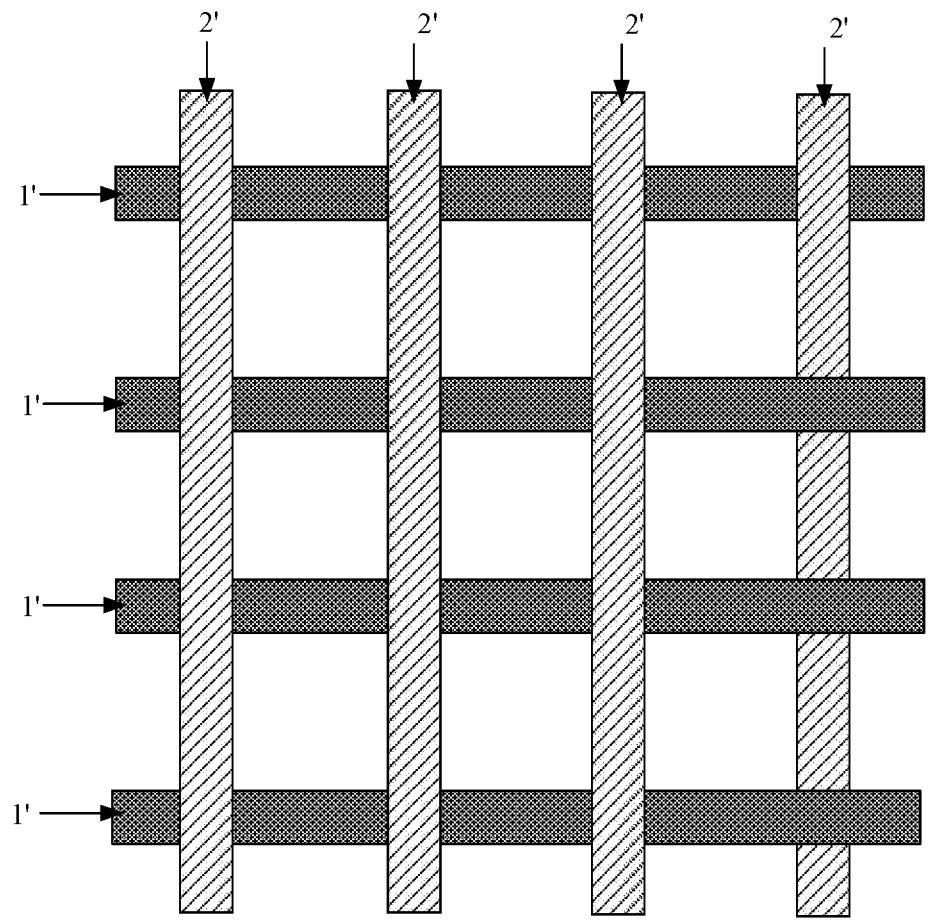
FIG. 1 is a top view of a mutual-capacitive fingerprint identification panel according to a technique.
Figure 2:
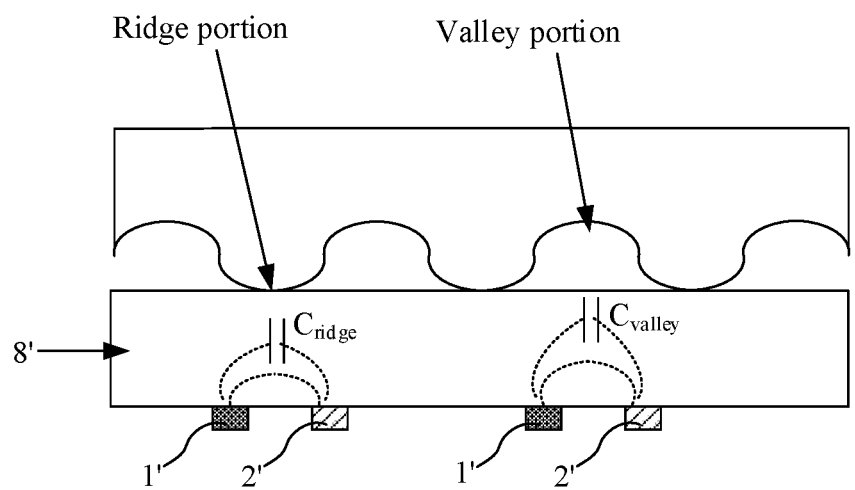
FIG. 2 is a schematic view illustrating that the mutual-capacitive fingerprint identification panel shown in FIG. 1 identifies a valley portion and a ridge portion of a fingerprint.

FIG. 1 is a top view of a mutual-capacitive fingerprint identification panel according to a technique; and FIG. 2 is a schematic view illustrating that the mutual-capacitive fingerprint identification panel shown in FIG. 1 identifies a valley portion and a ridge portion of a fingerprint. As shown in FIG. 1 and FIG. 2, the mutual-capacitive fingerprint identification panel comprises: a driving electrode 1' and a sensing electrode 2'. During identifying the fingerprint, a scan driving signal is applied to the driving electrode 1', the sensing electrode 2' generates an induction signal, an electric quantity output by the sensing electrode 2' per unit time is detected, a mutual capacitance between the driving electrode and the sensing electrode according to the electric quantity is determined, and finally the valley portion and the ridge portion of the finger touching the fingerprint identification panel are determined based on an amount of the mutual capacitance.

For example, with further reference to FIG. 1 and FIG. 2, the finger (which is a conductor) touches a cover plate 8' (generally made of a transparent material, for example, glass) of the mutual-capacitive fingerprint identification panel, the ridge portion of the finger is closer to the electrodes 1' and 2' than the valley portion of the finger, so an electric quantity taken away by the ridge portion is greater than an electric quantity taken away by the valley portion; an electric quantity $Q_{ridge}$ output by the sensing electrode 2' at a position of the ridge portion based on a mutual capacitance sensing principle is less than an electric quantity $Q_{valley}$ output by the sensing electrode 2' at a position of the valley portion based on the mutual capacitance sensing principle; because the electric quantity and a capacitance value are positively correlated, a capacitance value $C_{ridge}$ measured at the position of the ridge portion is less than a capacitance value $C_{valley}$ measured at the position of the valley portion.

For example, an identification sensitivity of the fingerprint identification panel is evaluated by a difference between the capacitance value $C_{valley}$ measured at the position of the valley portion and the capacitance value $C_{ridge}$ measured at the position of the ridge portion; the greater the difference is, the higher the identification sensitivity is. However, it is found that the above-described mutual-capacitive fingerprint identification panel has relatively low identification sensitivity, and thus a relatively high requirement for a thickness of the cover plate 8 is proposed, for example, the thickness of the cover plate 8 is required to be less than 200 μm.

Figure 3:
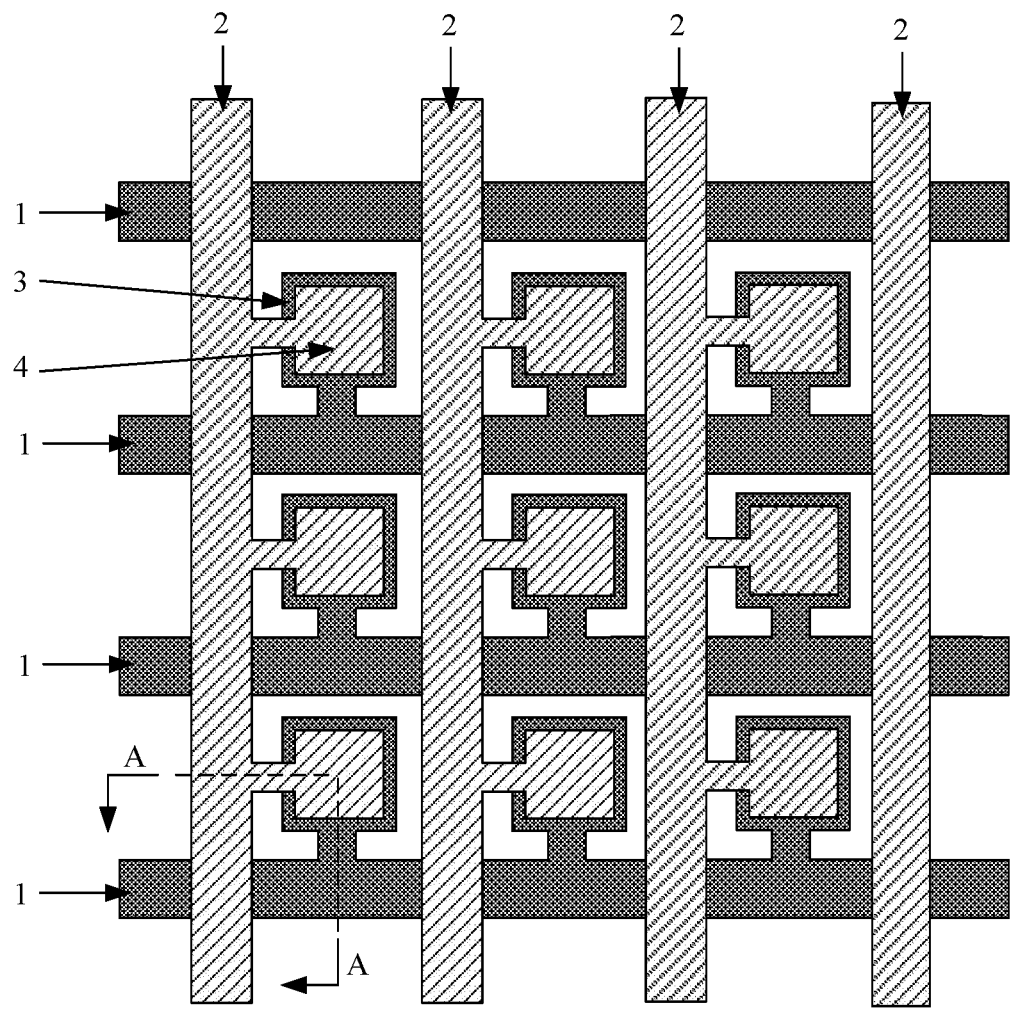
FIG. 3 is a top view of a fingerprint identification panel provided by embodiments of the present disclosure.
Figure 4:
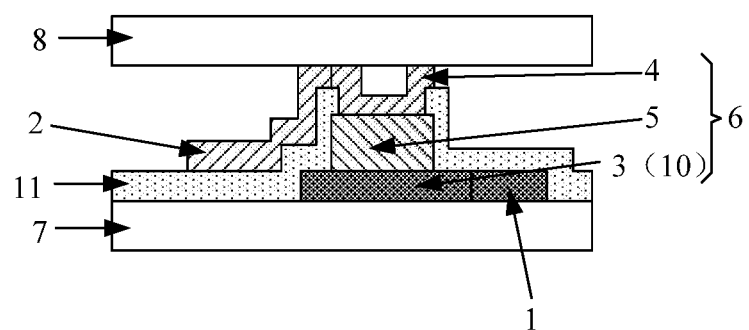
FIG. 4 is a cross-sectional schematic view taken along line A-A in FIG. 3.

FIG. 3 is a top view of a fingerprint identification panel provided by the embodiments of the present disclosure; and FIG. 4 is a cross-sectional schematic view taken along line A-A in FIG. 3. As shown in FIG. 3 and FIG. 4, the fingerprint identification panel according to the embodiments of the present disclosure comprises: a base substrate 7 and a cover plate 8; a driving electrode 1 and a sensing electrode 2 insulated from and intersecting with each other are formed between the base substrate 7 and the cover plate 8, the driving electrode 1 and the sensing electrode 2 intersecting with each other define an identification unit, the identification unit is provided therein with a photoelectric converter unit 6; the photoelectric converter unit 6 includes: a light shielding electrode 10, a second electrode 4 and a photoelectric converter layer 5; the photoelectric converter layer 5 is located between the light shielding electrode 10 and the second electrode 4, and the light shielding electrode 10 is located between the photoelectric converter layer 5 and the base substrate 7.

For example, the light shielding electrode 10 includes a first electrode 3; one of the first electrode 3 and the second electrode 4 is electrically connected with the driving electrode 1, and the other of the first electrode 3 and the second electrode 4 is electrically connected with the sensing electrode 2.

According to the embodiments of the present disclosure, the light shielding electrode 10 not only has an electrically conductive function, but also has a light shielding function. The light shielding electrode 10 is located between the base substrate 7 and the photoelectric converter layer 5, that is, the light shielding electrode 10 is located below the photoelectric converter layer 5, so that the light shielding electrode 10 is capable of shielding light incident from a side of the fingerprint identification panel on which the base substrate 7 is provided and emitted toward the photoelectric converter layer 5.

For example, a surface of the cover plate 8 facing away from the base substrate 7 is touched by a finger, a region of the surface of the cover plate 8 facing away from the base substrate 7 and corresponding to a position of a valley portion of the finger reflects light incident from the side of the fingerprint identification panel on which the base substrate 7 is provided to the photoelectric converter layer 5.

For example, the photoelectric converter layer 5 is made of a photoelectric conversion material, and the photoelectric converter layer 5 generates free electrons under an effect of the incident light.

For example, an insulating layer 11 is provided between the driving electrode 1 and the sensing electrode 2.

For example, the first electrode 3 is electrically connected with the driving electrode 1, and the second electrode 4 is electrically connected with the sensing electrode 2; or, the first electrode 3 is electrically connected with the sensing electrode 2, and the second electrode 4 is electrically connected with the driving electrode 1. In description below, a case where the first electrode 3 is electrically connected with the driving electrode 1, and the second electrode 4 is electrically connected with the sensing electrode 2 is described as an example.

For example, the fingerprint identification panel comprises a plurality of driving electrodes 1 and a plurality of sensing electrodes 2, the plurality of driving electrodes 1 and the plurality of sensing electrodes 2 intersect with each other to define a plurality of identification units, and each identification unit includes the photoelectric converter unit 6. In this case, that "the first electrode 3 is electrically connected with the driving electrode 1" as described above for example refers to that the first electrode 3 is electrically connected with the driving electrode 1 located closest to a first side of the first electrode 3, and that "the second electrode 4 is electrically connected with the sensing electrode 2" as described above specifically refers to that the second electrode 4 is electrically connected with the sensing electrode 2 located closest to a second side of the second electrode 4. In the drawings, a case where the "first side" is a left side and the "second side" is a lower side is illustrated exemplarily, and of course, the "first side" may be a right side in the drawings, and the "second side" may be an upper side in the drawings.

In addition, in the drawings, a case where a cross-sectional shape of the photoelectric converter unit 6 on a plane parallel to that where the base substrate 7 is located is a rectangle only serves as an example, which will not be limitative to the embodiments of the present disclosure. In the embodiments of the present disclosure, the cross-sectional shape of the photoelectric converter unit 6 on the plane parallel to that where the base substrate 7 is located may be other shapes, such as a circle, a triangle, or a polygon.

In order to facilitate those skilled in the art to understand the embodiments of the present disclosure, a working principle of the fingerprint identification panel provided by the embodiments of the present disclosure will be described in detail below in conjunction with the accompanying drawings. For example, the light shielding electrode 10 only includes the first electrode 3; in this case, the first electrode 3 is made of a light-shielding conductive material, and thus, the first electrode 3 simultaneously has an electrically conductive function and a light shielding function.

Figure 5:
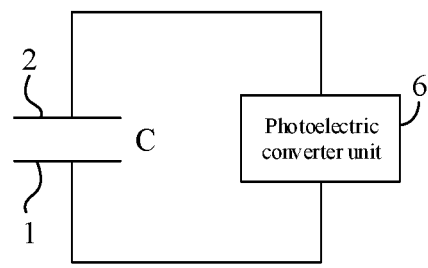
FIG. 5 is an equivalent circuit diagram of an identification unit of the fingerprint identification panel provided by the embodiments of the present disclosure.

FIG. 5 is an equivalent circuit schematic view of the fingerprint identification unit of the fingerprint identification panel provided by the embodiments of the present disclosure. As shown in FIG. 5, the fingerprint identification unit of the fingerprint identification panel comprises the photoelectric converter unit 6, and the driving electrode 1 and the sensing electrode 2 connected with the photoelectric converter unit 6. It can be seen that, the photoelectric converter unit 6 and a mutual capacitance C formed by the driving electrode 1 and the sensing electrode 2 connected with the photoelectric converter unit 6 are connected in parallel.

Figure 6:
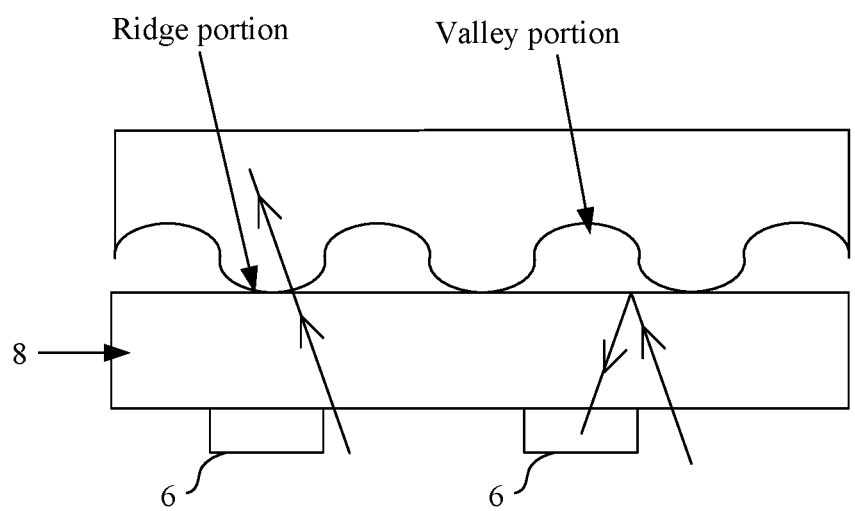
FIG. 6 is an optical schematic view at a valley portion and a ridge portion of a finger upon the finger touching a cover plate of the fingerprint identification panel provided by the embodiments of the present disclosure.

FIG. 6 is an optical schematic view at the valley portion and the ridge portion of the finger upon the finger touching the cover plate of the fingerprint identification panel. As shown in FIG. 6, the finger touches the cover plate 8, so that the finger shields light incident from a side of the fingerprint identification panel on which the cover plate 8 is provided, and thus, only light incident from the side of the fingerprint identification panel on which the base substrate 7 is provided is considered. In addition, the first electrode 3 having the light shielding function is provided below the photoelectric converter layer 5, so that the first electrode 3 shields light incident from the side of the fingerprint identification panel on which the base substrate 7 is provided and emitted toward the photoelectric converter layer 5, and, the light incident from the side of the fingerprint identification panel on which the base substrate 7 is provided only enters a region of the fingerprint identification panel where no first electrode 3 is provided.

For example, the light incident from the side of the fingerprint identification panel on which the base substrate 7 is provided transmits to a region of the surface of the cover plate 8 facing away from the base substrate 7 and corresponding to a position of the ridge portion of the finger; in this case, the ridge portion is closely pressed against the surface of the cover plate 8 facing away from the base substrate 7 and the ridge portion is an optically denser medium with respect to the cover plate 8, and thus, the light is refracted out of the cover plate 8 and is absorbed by the finger, that is, the photoelectric converter layer 5 within the identification unit corresponding to the position of the ridge portion does not receive light.

For example, the light incident from the side of the fingerprint identification panel on which the base substrate 7 is provided transmits to a region of the surface of the cover plate 8 facing away from the base substrate 7 and corresponding to a position of the valley portion of the finger; in this case, there is a gap between the valley portion and the cover plate 8, air is provided in the gap and the air is an optically thinner medium with respect to the cover plate 8, and thus, most of the light is totally reflected on the surface of the cover plate 8 facing away from the base substrate 7, and the reflected light is incident onto the photoelectric converter layer 5 within the identification unit corresponding to the position of the valley portion. The photoelectric converter layer 5 receives the reflected light, photons of the reflected light transfer energy to electrons in the photoelectric converter layer 5, the electrons are released from a nucleus after the electrons obtain sufficient energy and thus become free electrons.

For example, for a purpose of detecting the fingerprint, a scan driving signal is applied to the driving electrode 1 and a constant voltage signal is input to the sensing electrode 2. Since the first electrode 3 is electrically connected with the driving electrode 1 and the second electrode 4 is electrically connected with the sensing electrode 2, an electric field is formed between the first electrode 3 and the second electrode 4, and the free electrons generated within the photoelectric converter layer 5 move under the electric field to form a current.

Since the photoelectric converter unit 6 within the fingerprint identification unit corresponding to the position of the valley portion is illuminated by the reflected light, a large amount of free electrons are generated in the photoelectric converter layer 5 within the identification unit corresponding to the position of the valley portion, the free electrons move under the electric field to form the current, and the second electrode 4 of the photoelectric converter unit 6 outputs an electric quantity, to the sensing electrode 2 with which the second electrode 4 of the photoelectric converter unit 6 is connected. Therefore, an electric quantity output by the sensing electrode 2 of the identification unit at the position of the valley portion per unit time (a product of an equivalent current and unit time in the sensing electrode 2) includes an electric quantity $Q_{valley}$ output by the sensing electrode 2 based on a mutual capacitance sensing principle and an electric quantity $Q_{light}$ output by the photoelectric converter unit 6 illuminated by the reflected light.

Since the photoelectric converter unit 6 within the fingerprint identification unit corresponding to the position of the ridge portion is not illuminated by light, very few free electrons or no free electrons present within the photoelectric converter layer 5 within the fingerprint identification unit corresponding to the position of the ridge portion, that is, the second electrode 4 of the photoelectric converter unit 6 does not output electric quantity. Therefore, an electric quantity output by the sensing electrode 2 of the fingerprint identification unit at the position of the ridge portion per unit time only includes an electric quantity $Q_{ridge}$ output by the sensing electrode 2 based on the mutual capacitance sensing principle.

A capacitance value $C_{valley}$ measured at the position of the valley portion is determined by the electric quantity $Q_{valley}$ and the electric quantity $Q_{light}$, and a capacitance value $C_{ridge}$ measured at the position of the ridge portion is determined by the electric quantity $Q_{ridge}$. Therefore, as compared with the fingerprint identification panel shown in FIG. 1 and FIG. 2 that the capacitance value measured at the position of the valley portion is only determined by the electric quantity $Q_{valley}$ and the capacitance value measured at the position of the ridge portion is only determined by the electric quantity $Q_{ridge}$, the embodiments of the present disclosure enable that the difference between the capacitance value $C_{valley}$ measured at the position of the valley portion and the capacitance value $C_{ridge}$ measured at the position of the ridge portion increases, so that sensitivity of fingerprint identification is increased.

For example, in the embodiments of the present disclosure, the fingerprint identification is implemented by using ambient light provided on the side of the base substrate 7 facing away from the photoelectric converter unit 6. For example, a light source (not shown) is provided on the side of the base substrate 7 facing away from the photoelectric converter unit 6, to increase an amount of the light reflected by the cover plate 8 and emitted toward the photoelectric converter layer 5, so that a value of the electric quantity $Q_{light}$ output by the photoelectric converter unit 6 increases, and thus the capacitance value $C_{valley}$ measured by the fingerprint identification panel at the position of the valley portion is increased and the identification sensitivity is increased.

For example, the material of the first electrode (i.e. the light-shielding conductive material) includes a metal material. In general, the metal material not only has better conductivity, but also has a better light shielding function.

For example, an orthogonal projection of the photoelectric converter layer 5 on a plane where the first electrode 3 is located is located within a region where the first electrode 3 is located, and in this case, the first electrode 3 completely covers the photoelectric converter layer 5, to enhance the light shielding effect.

For example, the first electrode 3 and the driving electrode 1 are provided in a same layer, the second electrode 4 and the sensing electrode 2 are provided in a same layer, and in this case, the first electrode 3 and the driving electrode 1 are prepared by using a single patterning process, and the second electrode 4 and the sensing electrode 2 are prepared by using a single patterning process, which effectively simplifies production processes.

Of course, in the embodiments of the present disclosure, the first electrode 3 and the driving electrode 1 may be provided in different layers, and the second electrode 4 and the sensing electrode 2 may be provided in different layers, which should also belong to the protection scope of the embodiments of the present disclosure.

The embodiments of the present disclosure provide the fingerprint identification panel, which has the photoelectric converter unit provided within the identification unit, the photoelectric converter unit and the mutual capacitance formed by the driving electrode and the sensing electrode which are connected with the photoelectric converter unit are connected in parallel; in the case that identification is performed on the position of the valley portion of the fingerprint, the second electrode of the photoelectric converter unit outputs the electric quantity to increase the electric quantity output by the sensing electrode, so that the capacitance value measured by the fingerprint identification panel at the position of the valley portion increases, and thus the identification sensitivity of the fingerprint identification panel is increased.

Figure 7:
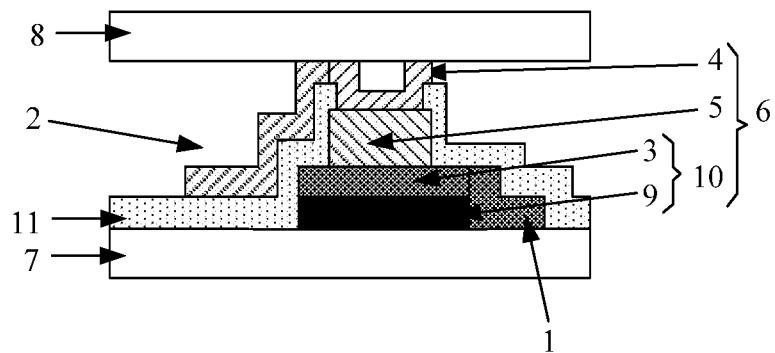
FIG. 7 is another cross-sectional schematic view of the fingerprint identification panel provided by the embodiments of the present disclosure.

FIG. 7 is another cross-sectional schematic view of the fingerprint identification panel provided by the embodiments of the present disclosure. As shown in FIG. 7, the structure is different from the structure shown in FIG. 4 is that, the light shielding electrode 10 not only includes the first electrode 3, but also includes a light shielding pattern 9; the light shielding pattern 9 and the first electrode 3 are provided in different layers, and an orthogonal projection of the photoelectric converter layer 5 on a plane where the light shielding pattern 9 is located is located in a region where the light shielding pattern 9 is located.

In the structure shown in FIG. 7, since the light shielding pattern 9 is additionally provided, the first electrode 3 is made of a light-shielding conductive material or a transparent conductive material. For example, the light shielding pattern 9 and the first electrode 3 are made of different materials.

As compared with the structure shown in FIG. 4, the structure shown in FIG. 7 facilitates flexible design and adjustment of a light shielding region by additionally providing the light shielding pattern 9, and improves the light shielding performance of the light shielding electrode 10. However, the structure without the light shielding pattern shown in FIG. 4 is more favorable for reducing a thickness of the fingerprint identification panel and reducing production processes.

For example, as shown in FIG. 7, the light shielding pattern 9 is located between the first electrode 3 and the base substrate 7; however, the embodiments of the present disclosure is not limited thereto. For example, the light shielding pattern 9 is located between the first electrode 3 and the photoelectric converter layer 5, and in this case, the light shielding pattern 9 needs to be made of the light-shielding conductive material, so that the first electrode 3 and the photoelectric converter layer 5 are electrically connected with each other.

According to the embodiments of the present disclosure, a driving method of a fingerprint identification panel is further provided, and the driving method is used for driving the fingerprint identification panel as described above. The driving method comprises: driving the driving electrode. For example, the driving the driving electrode includes: inputting a scan driving signal to the driving electrode.

For example, the fingerprint identification panel includes a plurality of driving electrodes 1 and a plurality of sensing electrodes 2, the plurality of driving electrodes 1 and the plurality of sensing electrodes 2 intersect with each other to define a plurality of identification units, and each identification unit includes the photoelectric converter unit 6.

Figure 8:
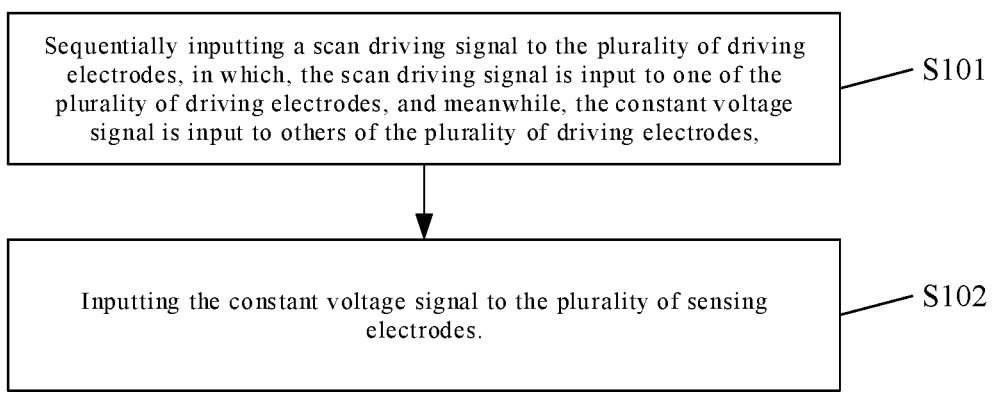
FIG. 8 is a flow chart of a driving method of a fingerprint identification panel provided by the embodiments of the present disclosure.

FIG. 8 is a flow chart of the driving method of the fingerprint identification panel provided by the embodiments of the present disclosure. As shown in FIG. 8, the driving method comprises:

Step S101: sequentially inputting the scan driving signal to the plurality of driving electrodes.

For example, the step S101 includes: inputting a constant voltage signal to others of the plurality of driving electrodes while inputting the scan driving signal to one of the plurality of driving electrodes.

Step S102: inputting the constant voltage signal to the plurality of sensing electrodes.

For example, step S101 and step S102 are performed simultaneously. For example, the scan driving signal and the constant voltage signal are different, so as to form a voltage difference between the driving electrode and the sensing electrode. For example, the constant voltage signal in step S101 is the same as the constant voltage signal in step S102.

In the embodiments of the present disclosure, the identification units are driven row by row. For example, a certain row of identification units are driven, it is not only necessary to input the scan driving signal (for example, a square wave signal) to the driving electrode corresponding to the certain row of fingerprint identification units, but also it is necessary to input the constant voltage signal to the driving electrodes corresponding to other rows of fingerprint identification units, and meanwhile, it is necessary to input the constant voltage signal to the sensing electrodes. With respect to the above-described certain row of fingerprint identification units that are driven, there is a voltage difference between two electrodes of the photoelectric converter units in respective fingerprint identification units so that an electric field is formed between the two electrodes; in the case that free electrons are generated in the photoelectric converter layer due to light illumination, the free electrons move under the electric field to form a current, so that there is an electric quantity output. However, with respect to the other rows of fingerprint identification units, two electrodes of photoelectric converter units in respective fingerprint identification units have a same voltage, so that no electric field is formed between the first electrode and the second electrode; in this case, even if free electrons are generated in the photoelectric converter layer due to light illumination, the free electrons do not move, so no current is output, that is, no electric quantity is output, and thus erroneous output of other rows of fingerprint identification units is effectively avoided.

Figure 9:
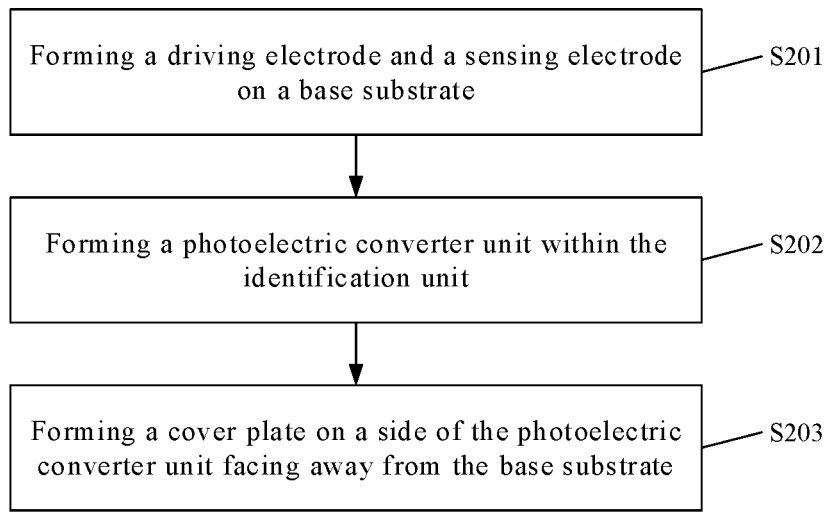
FIG. 9 is a flow chart of a preparation method of a fingerprint identification panel provided by the embodiments of the present disclosure.

FIG. 9 is a flow chart of a preparation method of a fingerprint identification panel provided by the embodiments of the present disclosure, and the preparation method is used for preparing the fingerprint identification panel as described above. As shown in FIG. 9, the preparation method comprises:

Step S201: forming a driving electrode and a sensing electrode on a base substrate.

For example, the driving electrode and the sensing electrode are insulated from and intersecting with each other, and the driving electrode and the sensing electrode intersecting with each other define an identification unit.

Step S202: forming a photoelectric converter unit within the identification unit.

For example, the photoelectric converter unit includes: a light shielding electrode, a second electrode and a photoelectric converter layer, the photoelectric converter layer is located between the light shielding electrode and the second electrode, the light shielding electrode is located between the photoelectric converter layer and the base substrate, and the light shielding electrode includes: a first electrode; one of the first electrode and the second electrode is electrically connected with the driving electrode, and the other of the first electrode and the second electrode is electrically connected with the sensing electrode.

Step S203: forming a cover plate on a side of the photoelectric converter unit facing away from the base substrate.

For example, the surface of the cover plate 8 facing away from the base substrate is touched by the finger, a region of the surface of the cover plate facing away from the base substrate and corresponding to the valley portion of the finger reflects light incident from the side of the fingerprint identification panel on which the base substrate is provided to the photoelectric converter layer.

Figure 10:
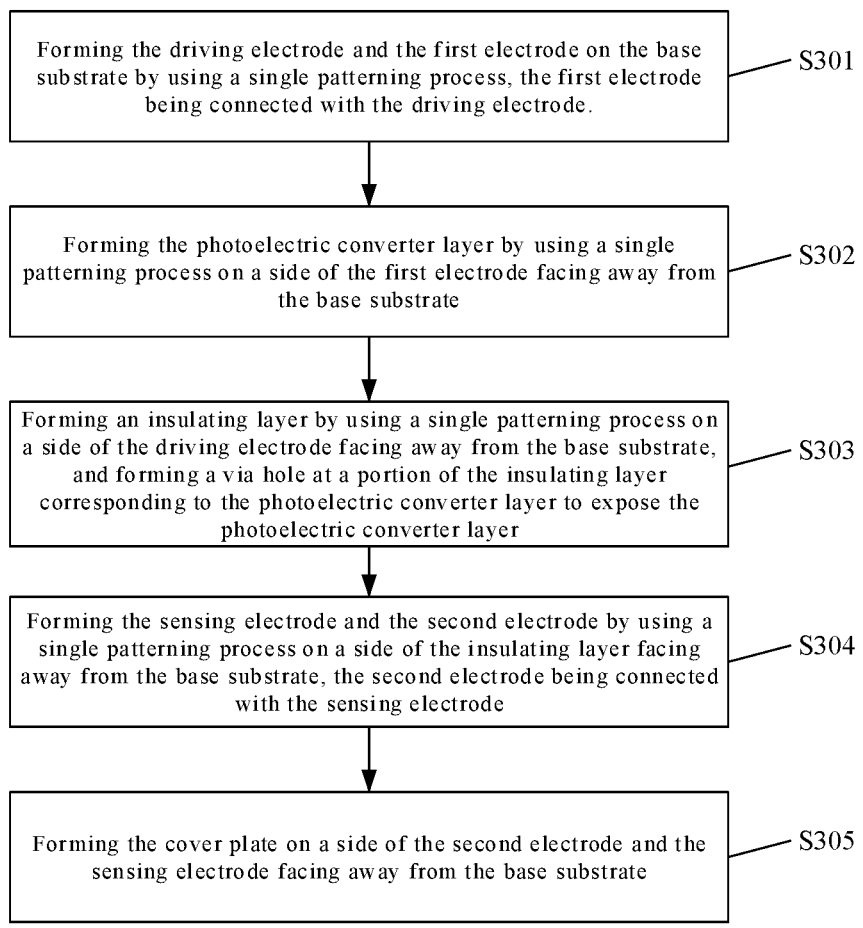
FIG. 10 is a more detailed flow chart of the preparation method of the fingerprint identification panel provided by the embodiments of the present disclosure.

FIG. 10 is a more detailed flow chart of the preparation method of the fingerprint identification panel provided by the embodiments of the present disclosure, which is used for preparing the fingerprint identification panel shown in FIG. 4. FIG. 11a to FIG. 11d are intermediate structural schematic views of the fingerprint identification panel prepared by using the preparation method shown in FIG. 10. As shown in FIG. 10, and FIG. 11a to FIG. 11d, the preparation method comprises:

Step S301: forming the driving electrode and the first electrode on the base substrate by using a single patterning process, the first electrode being electrically connected with the driving electrode.

Figure 11A:
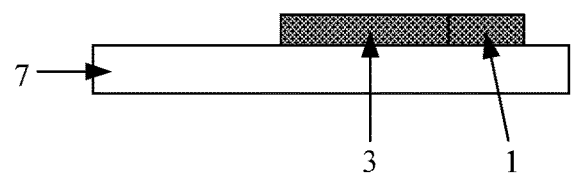
FIG. 11a to FIG. 11d are intermediate structural schematic views of the fingerprint identification panel prepared by using the preparation method shown in FIG. 10.

Firstly, a light-shielding conductive material thin film is formed on the base substrate 7, and then a single patterning process is performed on the light-shielding conductive material thin film, to obtain the first electrode 3 and the driving electrode 1, as shown in FIG. 11a.

For example, the patterning process according to the embodiments of the present disclosure includes processes such as photoresist coating, exposure, development, etching, photoresist stripping and the like.

For example, the light-shielding conductive material is a metal material. For example, the first electrode 3 itself serves as the light shielding electrode 10.

Step S302: forming the photoelectric converter layer by using a single patterning process on a side of the first electrode facing away from the base substrate.

Figure 11B:
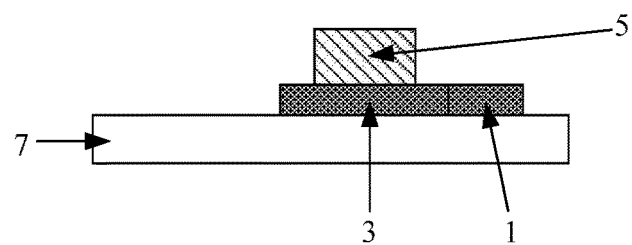

Firstly, a photoelectric conversion material thin film is formed on the side of the first electrode facing away from the base substrate 7, then a single patterning process is performed on the photoelectric conversion material thin film, to obtain the photoelectric converter layer 5, as shown in FIG. 11b. For example, an orthogonal projection of the photoelectric converter layer 5 on a plane where the first electrode 3 is located is located within a region where the first electrode 3 is located, and the first electrode 3 shields the light incident from the side of the fingerprint identification panel on which the base substrate 7 is provided toward the photoelectric converter layer 5.

Step S303: forming an insulating layer by using a single patterning process on a side of the driving electrode facing away from the base substrate, and forming a via hole at a portion of the insulating layer corresponding to the photoelectric converter layer to expose the photoelectric converter layer.

Figure 11C:
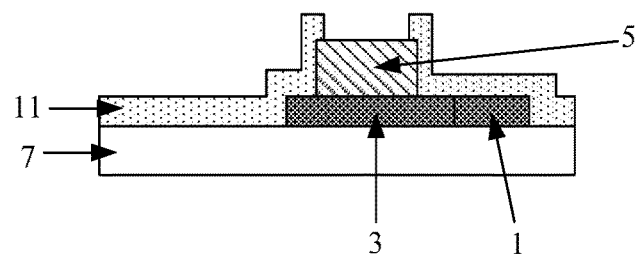
Figure 11D:
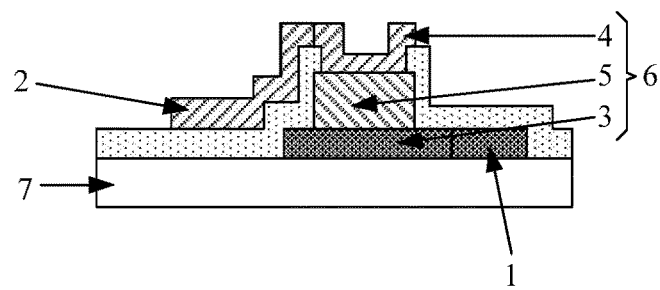

An insulating material thin film is formed on the side of the driving electrode facing away from the base substrate, and then a single patterning process is performed on the insulating material thin film, to obtain the insulating layer 11, as shown in FIG. 11c. For example, the via hole is formed at the portion of the insulating layer 11 corresponding to the photoelectric converter layer 5 to expose the photoelectric converter layer 5.

Step S304: forming the sensing electrode and the second electrode by using a single patterning process on a side of the insulating layer facing away from the base substrate, the second electrode being connected with the sensing electrode.

Firstly, a transparent conductive material thin film is formed on the side of the insulating layer 11 facing away from the base substrate 7, and then a single patterning process is performed on the transparent conductive material thin film, to obtain the second electrode 4 and the sensing electrode 2, as shown in FIG. 10d. For example, the second electrode 4 is connected with the photoelectric converter layer 5 through the via hole in the insulating layer.

Step S305: forming the cover plate on a side of the second electrode and the sensing electrode facing away from the base substrate.

The cover plate 8 is provided on the structure fabricated in step S304, to obtain the fingerprint identification panel shown in FIG. 3 and FIG. 4.

For example, in step S301, the sensing electrode and the first electrode are formed on the base substrate by using a single patterning process, and the first electrode is electrically connected with the sensing electrode; correspondingly, in step S304, the driving electrode and the second electrode are formed on the side of the insulating layer facing away from the base substrate, and the second electrode is connected with the driving electrode.

Figure 12:
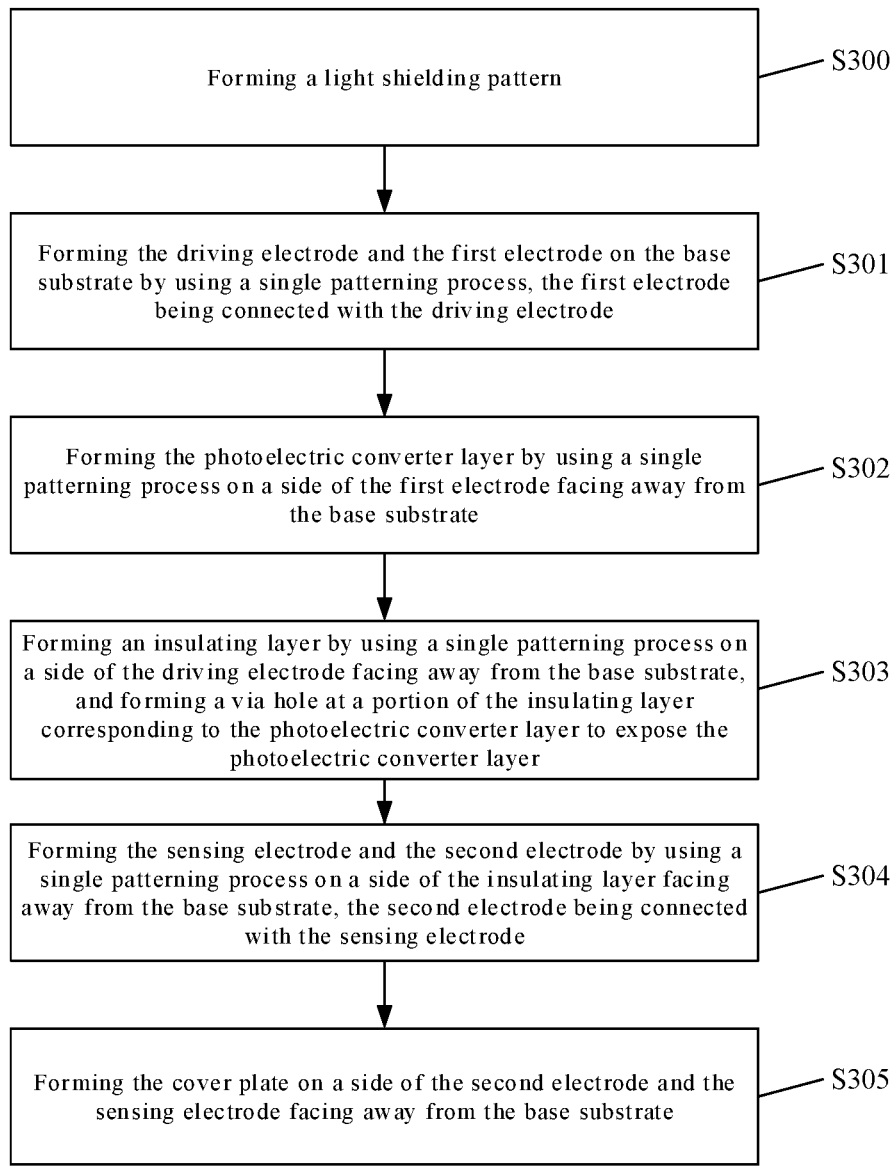
FIG. 12 is another detailed flow chart of the preparation method of the fingerprint identification panel provided by the embodiments of the present disclosure.

FIG. 12 is another more detailed flow chart of the preparation method of the fingerprint identification panel provided by the embodiments of the present disclosure, which is used for preparing the fingerprint identification panel shown in FIG. 7. As shown in FIG. 12, the preparation method not only comprises step S301 to step S305 as described above, but also comprises step S300. For step S301 and step S305, corresponding descriptions of FIG. 10 may be referred to, and only step S300 is described below.

Step S300: forming a light shielding pattern.

The first electrode 3 and the light shielding pattern 9 together constitute the light shielding electrode. For example, the light shielding pattern 9 and the first electrode 3 are provided in different layers, and an the orthogonal projection of the photoelectric converter layer 5 that is subsequently formed on a plane where the light shielding pattern 9 is located is located in a region where the light shielding pattern 9 is located.

For example, step S300 is performed before step S301, or is performed between step S301 and step S302. In a case where step S300 is performed between step S301 and step S302, the light shielding pattern 9 is made of a light-shielding conductive material, to ensure that the first electrode 3 and the photoelectric converter layer 5 are electrically connected with each other.

For example, in a case where the light shielding pattern 9 is formed, whether or not the material of the first electrode 3 has a light-shielding function will not be limited.

The embodiments of the present disclosure further provide a fingerprint identification device, comprising the fingerprint identification panel as described above. For the fingerprint identification panel, contents of the foregoing embodiments may be referred to, which will not be repeated here.

The foregoing embodiments merely are exemplary embodiments of the disclosure, and not intended to define the scope of the disclosure, and the scope of the disclosure is determined by the appended claims.

The invention claimed is:

1. A fingerprint identification panel, comprising: a base substrate and a cover plate provided opposite to each other, wherein,
a driving electrode and a sensing electrode insulated from and intersecting with each other are provided between the base substrate and the cover plate, the driving electrode and the sensing electrode intersecting with each other define an identification unit, the identification unit is provided therein with a photoelectric converter unit;
the photoelectric converter unit includes: a light shielding electrode, a second electrode and a photoelectric converter layer, the photoelectric converter layer is located between the light shielding electrode and the second electrode, and the light shielding electrode is located between the photoelectric converter layer and the base substrate; and
the light shielding electrode includes a first electrode, one of the first electrode and the second electrode is electrically connected with the driving electrode, and the other of the first electrode and the second electrode is electrically connected with the sensing electrode.

2. The fingerprint identification panel according to claim 1, wherein, the first electrode is made of a light-shielding conductive material, and an orthogonal projection of the photoelectric converter layer on a plane where the first electrode is located is located within a region where the first electrode is located.

3. The fingerprint identification panel according to claim 1, wherein, the light shielding electrode further comprises a light shielding pattern provided in a layer different from the first electrode, and an orthogonal projection of the photoelectric converter layer on a plane where the light shielding pattern is located is located within a region where the light shielding pattern is located.

4. The fingerprint identification panel according to claim 3, wherein, the light shielding pattern is located between the first electrode and the base substrate.

5. The fingerprint identification panel according to claim 3, wherein, the light shielding pattern is located between the first electrode and the photoelectric converter layer, and the light shielding pattern is made of a light-shielding conductive material.

6. The fingerprint identification panel according to claim 1, wherein, the first electrode is electrically connected with and is provided in a same layer as the driving electrode, and the second electrode is electrically connected with and is provided in a same layer as the sensing electrode.

7. The fingerprint identification panel according to claim 1, wherein, the first electrode is electrically connected with and is provided in a same layer as the sensing electrode, and the second electrode is electrically connected with and is provided in a same layer as the driving electrode.

8. A fingerprint identification device, comprising: the fingerprint identification panel according to claim 1.

9. A preparation method of a fingerprint identification panel, comprising:
forming a driving electrode and a sensing electrode insulated from and intersecting with each other on a base substrate, wherein, the driving electrode and the sensing electrode intersecting with each other define an identification unit;
forming a photoelectric converter unit within the identification unit, wherein, the photoelectric converter unit includes a light shielding electrode, a second electrode and a photoelectric converter layer, the photoelectric converter layer is located between the light shielding electrode and the second electrode, the light shielding electrode is located between the photoelectric converter layer and the base substrate, the light shielding electrode includes a first electrode, one of the first electrode and the second electrode is electrically connected with the driving electrode, and the other of the first electrode and the second electrode is electrically connected with the sensing electrode; and
forming a cover plate on a side of the photoelectric converter unit facing away from the base substrate.

10. The preparation method of the fingerprint identification panel according to claim 9, wherein, the forming the driving electrode and the sensing electrode and the forming the photoelectric converter unit include:
forming the driving electrode and the first electrode on the base substrate by using a single patterning process, the first electrode being electrically connected with the driving electrode;
forming the photoelectric converter layer by using a single patterning process on a side of the first electrode facing away from the base substrate;
forming an insulating layer by using a single patterning process on a side of the driving electrode facing away from the base substrate, and forming a via hole at a portion of the insulating layer corresponding to the photoelectric converter layer to expose the photoelectric converter layer; and
forming the sensing electrode and the second electrode by using a single patterning process on a side of the insulating layer facing away from the base substrate, the second electrode being electrically connected with the sensing electrode, and the second electrode being connected with the photoelectric converter layer through the via hole.

11. The preparation method of the fingerprint identification panel according to claim 9, wherein, the forming the driving electrode and the sensing electrode and the forming the photoelectric converter unit include:
forming the sensing electrode and the first electrode on the base substrate by using a single patterning process, the first electrode being electrically connected with the sensing electrode;
forming the photoelectric converter layer by using a single patterning process on a side of the first electrode facing away from the base substrate;
forming an insulating layer by using a single patterning process on a side of the sensing electrode facing away from the base substrate, and forming a via hole at a portion of the insulating layer corresponding to the photoelectric converter layer to expose the photoelectric converter layer; and
forming the driving electrode and the second electrode on the side of the insulating layer facing away from the base substrate, the second electrode being connected with the driving electrode, and the second electrode being connected with the photoelectric converter layer through the via hole.

12. The preparation method of the fingerprint identification panel according to claim 9, wherein, the first electrode is made of a light-shielding conductive material, and an orthogonal projection of the photoelectric converter layer on a plane where the first electrode is located is located within a region where the first electrode is located.

13. The preparation method of the fingerprint identification panel according to claim 9, wherein, the light shielding electrode further comprises a light shielding pattern, the light shielding pattern and the first electrode are provided in different layers, and an orthogonal projection of the photoelectric converter layer on a plane where the light shielding pattern is located is located in a region where the light shielding pattern is located.

14. The preparation method of the fingerprint identification panel according to claim 13, wherein, the light shielding pattern is located between the first electrode and the base substrate.

15. The preparation method of the fingerprint identification panel according to claim 13, wherein, the light shielding pattern is located between the first electrode and the photoelectric converter layer, and the light shielding pattern is made of a light-shielding conductive material.

16. A driving method of a fingerprint identification panel, the fingerprint identification panel being the fingerprint identification panel according to claim 1, wherein, the driving method comprises: inputting a scan driving signal to the driving electrode.

17. The driving method of the fingerprint identification panel according to claim 16, wherein,
the fingerprint identification panel comprises a plurality of driving electrodes and a plurality of sensing electrodes, the plurality of driving electrodes and the plurality of sensing electrodes intersect with each other to define a plurality of identification units, and each of the plurality of identification units includes a photoelectric converter unit; and
the method comprises: sequentially inputting the scan driving signal to the plurality of driving electrodes; inputting the scan driving signal to one of the plurality of driving electrodes, and meanwhile, inputting a constant voltage signal to others of the plurality of driving electrodes and inputting the constant voltage signal to the plurality of sensing electrodes.

\* \* \* \* \*